(12) United States Patent
Huang et al.

(10) Patent No.: US 11,581,260 B2
(45) Date of Patent: Feb. 14, 2023

(54) PACKAGE STRUCTURE AND MANUFACTURING METHOD THEREOF

(71) Applicant: Kore Semiconductor Co., Ltd., Qingdao (CN)

(72) Inventors: Chi-Ting Huang, New Taipei (TW); Ching-Yu Ni, New Taipei (TW); Hsiang-Hua Lu, New Taipei (TW); Ying-Chieh Pan, New Taipei (TW)

(73) Assignee: Kore Semiconductor Co., Ltd., Qingdao (CN)

( * ) Notice: Subject to any disclaimer, the term of this patent is extended or adjusted under 35 U.S.C. 154(b) by 0 days.

(21) Appl. No.: 17/097,263

(22) Filed: Nov. 13, 2020

(65) Prior Publication Data
US 2022/0122917 A1 Apr. 21, 2022

(30) Foreign Application Priority Data
Oct. 16, 2020 (CN) .......................... 202011111076.3

(51) Int. Cl.
*H01L 23/538* (2006.01)
*H01L 25/00* (2006.01)
(Continued)

(52) U.S. Cl.
CPC ...... *H01L 23/5381* (2013.01); *H01L 23/5385* (2013.01); *H01L 24/16* (2013.01); *H01L 24/17* (2013.01); *H01L 24/48* (2013.01); *H01L 24/73* (2013.01); *H01L 25/50* (2013.01); *H01L 21/568* (2013.01); *H01L 25/0655* (2013.01); *H01L 25/18* (2013.01); *H01L 2224/16238* (2013.01); *H01L 2224/1703* (2013.01); *H01L 2224/48105* (2013.01); *H01L 2224/48227* (2013.01);
(Continued)

(58) Field of Classification Search
CPC . H01L 23/5381; H01L 23/5385; H01L 24/16; H01L 24/17; H01L 24/48; H01L 24/73; H01L 25/50; H01L 25/0655; H01L 25/18; H01L 21/568; H01L 2224/16238; H01L 2224/1703; H01L 2224/48105; H01L 2224/48227; H01L 2224/73207; H01L 2924/1815; H01L 2924/18165
See application file for complete search history.

(56) References Cited

U.S. PATENT DOCUMENTS

2018/0269188 A1* 9/2018 Yu .......................... H01L 24/25

FOREIGN PATENT DOCUMENTS

| CN | 107104096 A | 8/2017 |
|----|-------------|--------|
| WO | 2019161641 A1 | 8/2019 |

* cited by examiner

*Primary Examiner* — Timor Karimy
(74) *Attorney, Agent, or Firm* — ScienBiziP, P.C.

(57) ABSTRACT

A package structure includes a first chip, a first redistribution layer, a second chip, a second redistribution layer, a third redistribution layer, a carrier, and a first molding compound layer. The first redistribution layer is arranged on a surface of the first chip. The second redistribution layer is arranged on a surface of the second chip. The third redistribution layer interconnects the first redistribution layer and the second redistribution layer. The carrier is arranged on a side of the third redistribution layer away from the first redistribution layer and the second redistribution layer. The first molding compound layer covers the first chip, the first redistribution layer, the second chip, and the second redistribution layer. A manufacturing method is also disclosed.

4 Claims, 5 Drawing Sheets

(51) Int. Cl.
  *H01L 23/00* (2006.01)
  *H01L 21/56* (2006.01)
  *H01L 25/065* (2023.01)
  *H01L 25/18* (2023.01)
(52) U.S. Cl.
  CPC ............... *H01L 2224/73207* (2013.01); *H01L 2924/1815* (2013.01); *H01L 2924/18165* (2013.01)

PACKAGE STRUCTURE AND MANUFACTURING METHOD THEREOF

FIELD

The subject matter relates to semiconductor packages, and in particular to a package structure and a manufacturing method thereof.

BACKGROUND

As an integrated electronic technology develops, requirements on chip performance continuously increase, such as function enhancement, size reduction, and reduction of energy consumption and costs. Therefore, a 3D IC (three-dimensional integrated circuit) technology and a 2.5D IC packaging technology have emerged. A silicon interposer (Silicon Interposer) technology is a technical solution for implementing interconnection between dies, and interconnection between a die and a substrate in the 3D IC technology and the 2.5D IC packaging technology.

2.5D IC packaging is used as an example. In the 2.5D IC packaging in the prior art, at least two dies are integrated into a fan-out unit (Fan out Unit) by using a fan-out wafer level package technology, and the fan-out unit is packaged on a substrate by using a silicon interposer. Both interconnection between the at least two dies and interconnection between a die and a substrate are implemented by using the silicon interposer. In a solution based on the silicon interposer technology, an interconnection line whose line width and node spacing are much less than those of a resin substrate is fabricated on a silicon chip by a semiconductor process. Therefore, chips with different functions, for example, a central processing unit (CPU) and a dynamic random access memory (DRAM) may be connected to one silicon interposer, and massive operations and data exchange can be completed by using the silicon interposer. The silicon interposer implements wiring by a through silicon via (TSV) technology. However, a TSV fabrication process is a deep reactive ion etching (DRIE) technology. In a TSV filling process, a seed layer is first generated on a surface of a TSV by a physical vapor deposition (PVD) technology, and then the process is completed by electroplating. A 2.5D IC packaging implementation solution in the prior art has disadvantages of a high-difficulty process and high production costs.

BRIEF DESCRIPTION OF THE DRAWINGS

Implementations of the present technology will now be described, by way of embodiments, with reference to the attached figures.

DETAILED DESCRIPTION

Implementations of the disclosure will now be described, by way of embodiments only, with reference to the drawings. The disclosure is illustrative only, and changes may be made in the detail within the principles of the present disclosure. It will, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein, but are not to be considered as limiting the scope of the embodiments.

Figure 1:
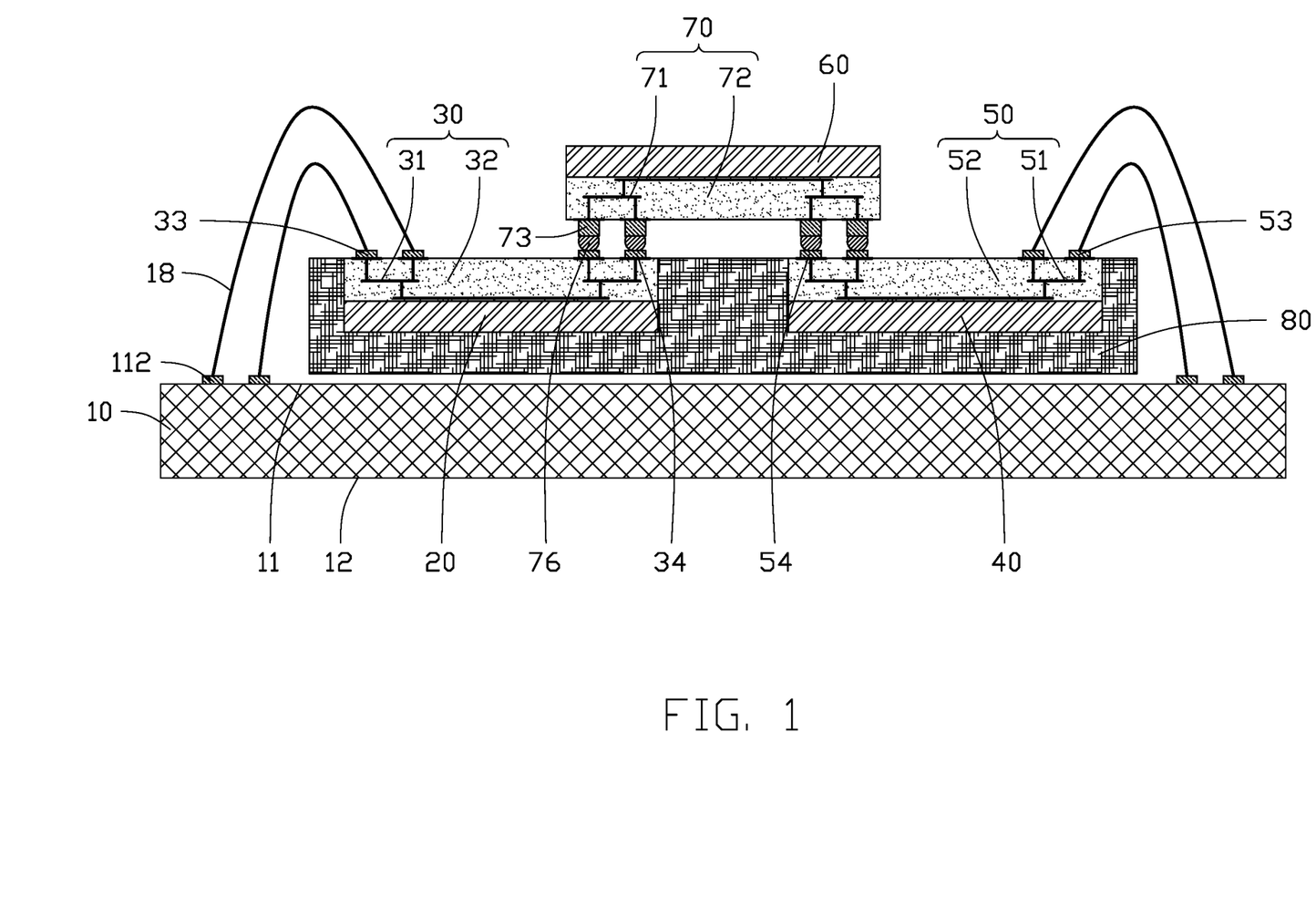
FIG. 1 is a cross-sectional view of a package structure in accordance with a first embodiment.

FIG. 1 illustrates a first embodiment of a package structure. The package structure includes a base board 10, a first chip 20, a first redistribution layer 30, a second chip 40, a second redistribution layer 50, a carrier 60, a third redistribution layer 70, and a first molding compound layer 80.

The base board 10 includes a first surface 11 and a second surface 12 facing away from the first surface 11. The first chip 20, the first redistribution layer 30, the second chip 40, the second redistribution layer 50, the carrier 60, the third redistribution layer 70, and the first molding compound layer 80 are all located above the first surface 11 of the base board 10. The first surface 11 is provided with a plurality of connecting portions 112 which are electrically connected to the first chip 20 and the second chip 40. The second surface 12 is electrically connected to a circuit board of an electronic device. The second surface 12 may be provided with a plurality of connections (not shown) which electrically connect with the circuit board of the electronic device. The base board 10 is provided with a wiring layer (not shown) therein, and the wiring layer electrically connects the connecting portions 112 on the first surface 11 and the connections on the second surface 12. Both of the connecting portions 112 and the connections are made of conductive materials, such as copper, aluminum, tungsten, gold, silver, nickel, or alloys thereof. Each of the connecting portions 112 and the connections may be a metal bump, a conductive pillar, or a solder ball.

The first redistribution layer 30 is arranged on a surface of the first chip 20 and is electrically connected to pins (not shown) of the first chip 20. The first redistribution layer 30 includes a first wiring 31 and a dielectric layer 32, and the first wiring 31 is electrically connected to the pins of the first chip 20. The dielectric layer 32 may include an organic material, such as polyimide, or an inorganic material, such as silicon nitride, silicon oxide or the like, not limited thereto. A first connection terminal 33 and a second connection terminal 34 are arranged on a surface of the first redistribution layer 30 facing away from the first chip 20. The first wiring 31 electrically connects the first connection terminal 33 and the second connection terminal 34.

The second redistribution layer 50 is arranged on a surface of the second chip 40 and is electrically connected to pins (not shown) of the second chip 40. The second redistribution layer 50 includes a second wiring 51 and a dielectric layer 52, and the second wiring 51 is electrically connected to the pins of the second chip 40. A surface of the second redistribution layer 50 facing away from the second chip 40 is provided with a first connection terminal 53 and a second connection terminal 54, the second wiring 51 electrically connects the first connection terminal 53 and the second connection terminal 54. The surface of the second redistribution layer 50 facing away from the second chip 40 is flush with the surface of the first redistribution layer 30 facing away from the first chip 40.

In one embodiment, the first chip 20 and the second chip 40 are functional chips, such as a radio frequency (RF) chip, a field programmable gate array (FPGA) chip, a digital signal processing (DSP) chip, a graphics processing unit (GPU) chip, or a central processing unit (CPU) chip.

The third redistribution layer 70 is located on a same side of the first redistribution layer 30 and the second redistribution layer 50, and electrically connects the first redistribution layer 30 and the second redistribution layer 50. The third redistribution layer 70 includes a third wiring 71 and a dielectric layer 72. A surface of the third redistribution layer 70 facing away from the carrier 60 is provided with a plurality of third connection terminals 73 which are electrically connected to the third wiring 71. The third connection terminals 73 are respectively connected to the second connection terminals 34 on the first redistribution layer 30 and the second connection terminals 54 on the second redistribution layer 50, so that the third redistribution layer 70 electrically connects the first redistribution layer 30 and the second redistribution layer 50, thereby achieving electrical connection between the first chip 20 and the second chip 40. In one embodiment, the third connection terminals 73 are electrically connected to the second connection terminals 34 and 54 by a plurality of solder balls 76.

The carrier 60 is arranged on a surface of the third redistribution layer 70 facing away from the first redistribution layer 30 and the second redistribution layer 50 and supports the third redistribution layer 70. In one embodiment, the carrier is a dummy die.

A process for manufacturing each of the first redistribution layer 30, the second redistribution layer 50, and the third redistribution layer 70 may be implemented by using a layer-adding process which is similar to a method for manufacturing a circuit layer on a surface of a circuit board in the prior art. Redistribution layers made in this way are easy to manufacture, and the cost is low.

The first connection terminal 33 on the first redistribution layer 30 is electrically connected to a portion of the connecting portions 112 to achieve electrical connection between the first chip 20 and the base board 10. The first connection terminal 53 on the second redistribution layer 50 is electrically connected to the remaining connecting portions 112 to achieve electrical connection between the second chip 40 and the first base board 10. In one embodiment, the package structure further includes a plurality of wires 18, the first connection terminal 33 on the first redistribution layer 30 and the first connection terminal 53 on the second redistribution layer 50 are electrically connected to the connecting portions 112 by the wires 18.

The first molding compound layer 80 covers the first chip 20, the first redistribution layer 30, the second chip 40, and the second redistribution layer 50. The surface of the first redistribution layer 30 facing away from the first chip 20 and the surface of the second redistribution layer 50 facing away from the second chip 40 are exposed from the first molding compound layer 80. In one embodiment, the first molding compound layer 80 is disposed adjacent to the base board 10, and the carrier 60 is disposed away from the base board 10.

The first molding compound layer 80 is made of a non-conductive material which includes one or more of EMC (epoxy molding compound), ABS (acrylonitrile-butadiene-styrene), PC (polycarbonate), PET (polyethylene terephthalate), and other injection molding materials.

Figure 2:
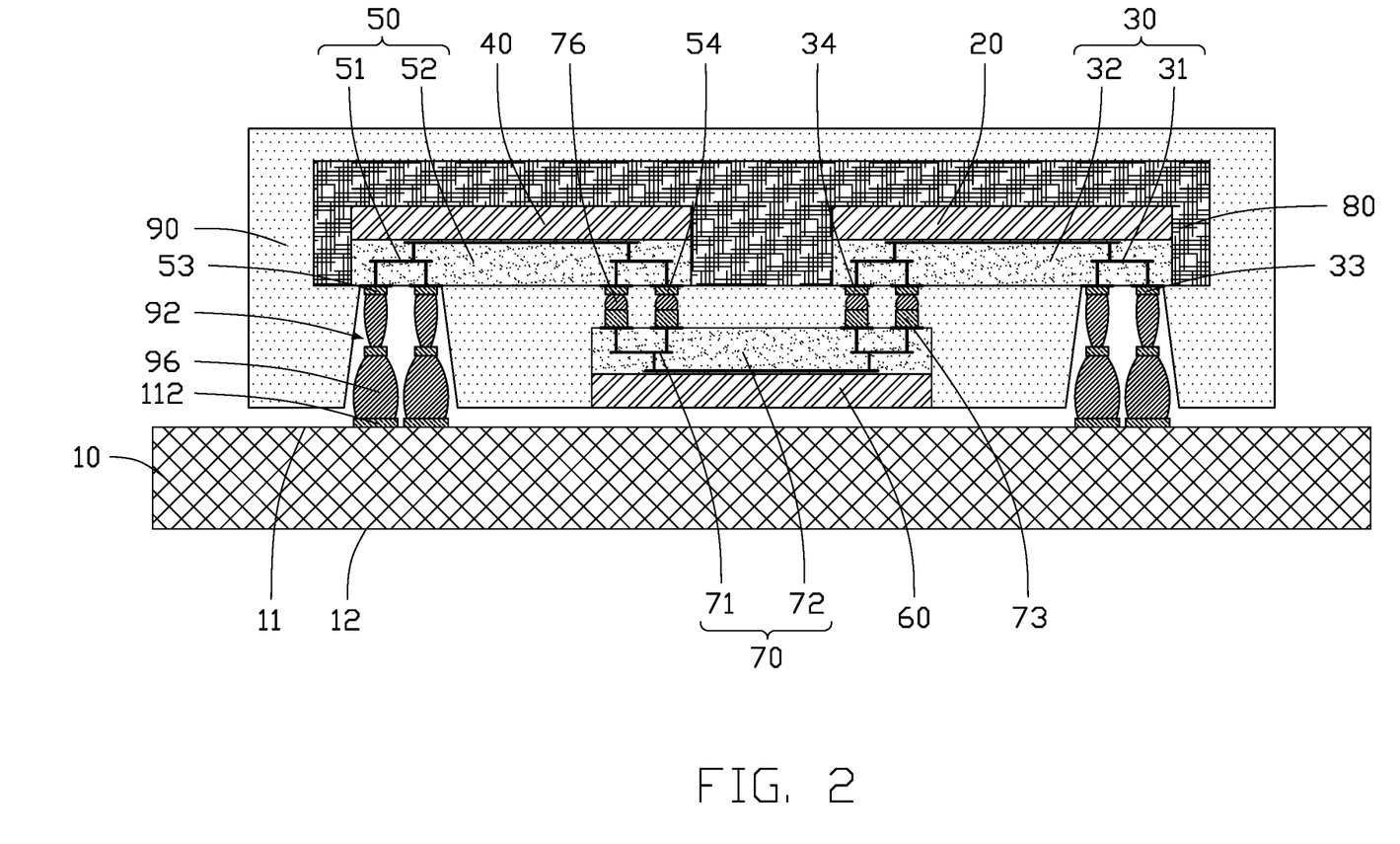
FIG. 2 is a cross-sectional view of a package structure in accordance with a second embodiment.

FIG. 2 illustrates that the first molding compound layer 80 is arranged away from the base board 10, and the carrier 60 is arranged adjacent to the base board 10. The package structure further includes a second molding compound layer 90 which covers the first molding compound layer 80, the first redistribution layer 30, and the second redistribution layer 50. The second molding compound layer 90 defines a plurality of through mold vias (TMVs) 92, the first connection terminal 33 on the first redistribution layer 30 and the first connection terminal 53 on the second redistribution layer 50 are exposed from the TMVs 92. The package structure further includes a plurality of conductive structures 96 which infill the TMVs 92 and are electrically connected to the connecting portions 112 of the base board 10.

A manufacturing method of the package structure in one embodiment is disclosed. The manufacturing method includes steps as follows.

Figure 3:
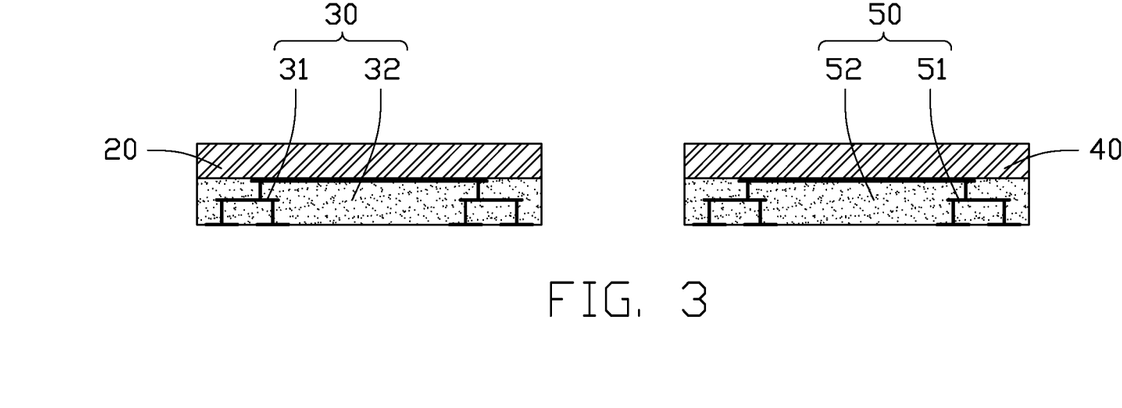
FIG. 3 is a cross-sectional view showing a first redistribution layer and a second redistribution layer respectively formed on a first chip and a second chip.

Referring to FIG. 3, a first chip 20 and a second chip 40 are provided, a first redistribution layer 30 is formed on a surface of the first chip 20, and a second redistribution layer 50 is formed on a surface of the second chip 40. The first redistribution layer 30 includes a first wiring 31 and a dielectric layer 32, and the first wiring 31 is electrically connected to pins (not shown) of the first chip 20. The dielectric layer 32 may include an organic material, such as polyimide, or an inorganic material, such as silicon nitride, silicon oxide or the like, not limited thereto. The first redistribution layer 30 on the first chip 20 and the second redistribution layer 50 on the second chip 40 are formed by using a layer-adding process.

In one embodiment, the first chip 20 and the second chip 40 are functional chips, such as a radio frequency (RF) chip, a field programmable gate array (FPGA) chip, a digital signal processing (DSP) chip, a graphics processing unit (GPU) chip, or a central processing unit (CPU) chip.

Figure 4:
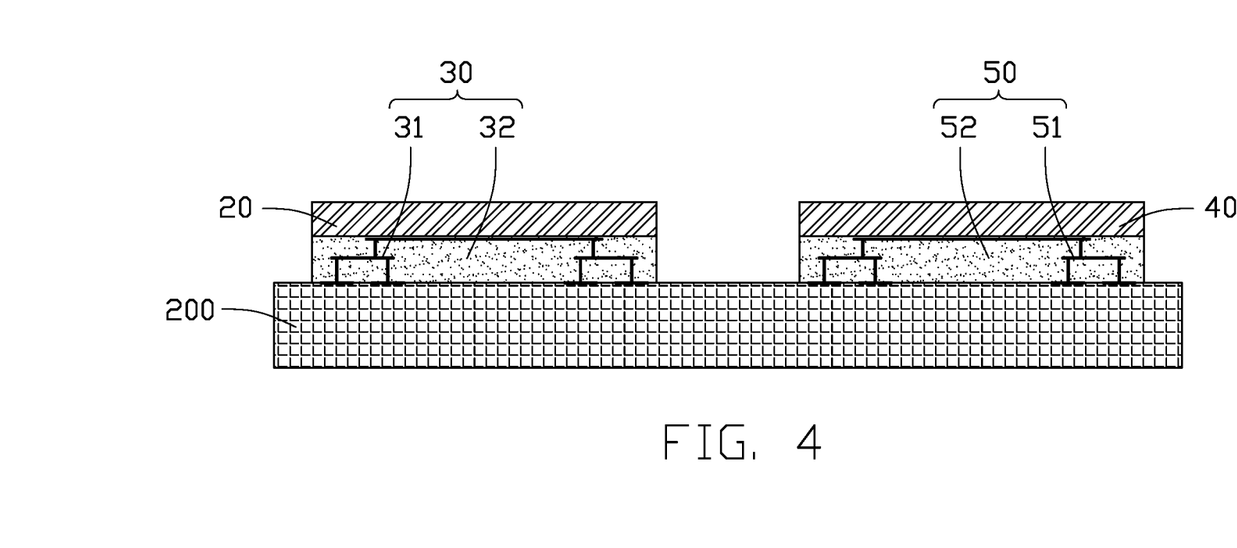
FIG. 4 is a cross-sectional view showing the structure of FIG. 3 mounted on a temporary carrier.

Referring to FIG. 4, the first redistribution layer 30 and the second redistribution layer 50 are both attached to a surface of a temporary carrier 200, a surface of the first redistribution layer 30 facing away from the first chip 20 being in contact with the temporary carrier 200, and a surface of the second redistribution layer 50 facing away from the second chip 40 being in contact with the temporary carrier 200. The surface of the second redistribution layer 50 facing away from the second chip 40 is flush with the surface of the first redistribution layer 30 facing away from the first chip 20.

Figure 5:
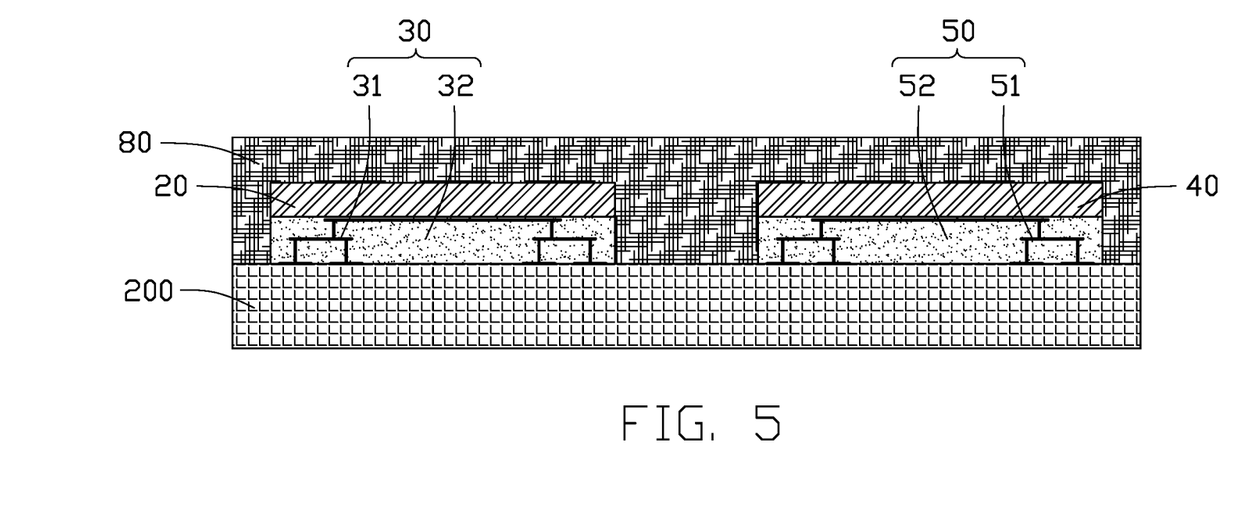
FIG. 5 is a cross-sectional view showing a molding compound layer formed on the structure of FIG. 4.

Referring to FIG. 5, a first molding compound layer 80 is formed to cover the first chip 20, the first redistribution layer 30, the second chip 40, and the second redistribution layer 50.

The first molding compound layer 80 is made of a non-conductive material which includes one or more of EMC (epoxy molding compound), ABS (acrylonitrile-butadiene-styrene), PC (polycarbonate), PET (polyethylene terephthalate), and other injection molding materials.

Figure 6:
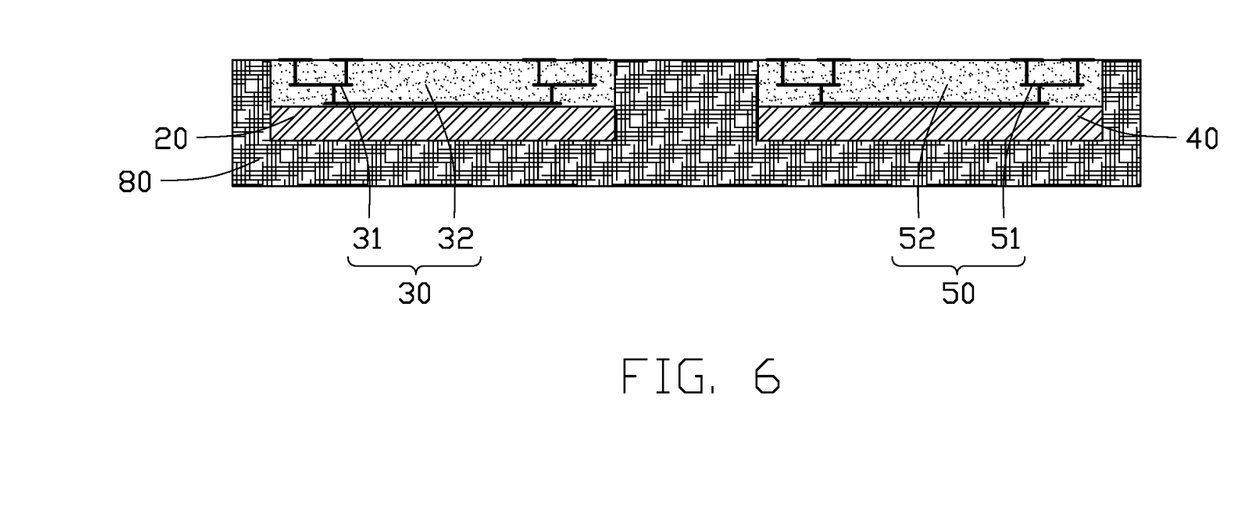
FIG. 6 is a cross-sectional view showing a structure of FIG. 5 after removing the temporary carrier.

Referring to FIG. 6, the temporary carrier 200 is removed to expose the surface of the first redistribution layer 30 facing away from the first chip 20 and the surface of the second redistribution layer 50 facing away from the second chip 40 outside the first molding compound layer 80.

Figure 7:
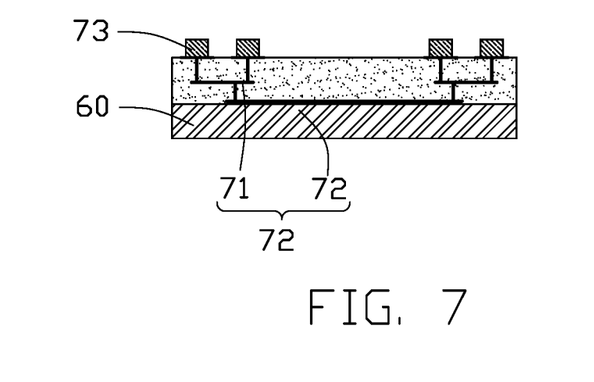
FIG. 7 is a cross-sectional view showing a third redistribution layer formed on a carrier.

Referring to FIG. 7, a carrier 60 is provided, and a third redistribution layer 70 is formed on a surface of the carrier 60. The carrier 60 supports the third redistribution layer 70.

In one embodiment, the carrier is a dummy die. The third redistribution layer 70 includes a third wiring 71 and a dielectric layer 72.

Figure 8:
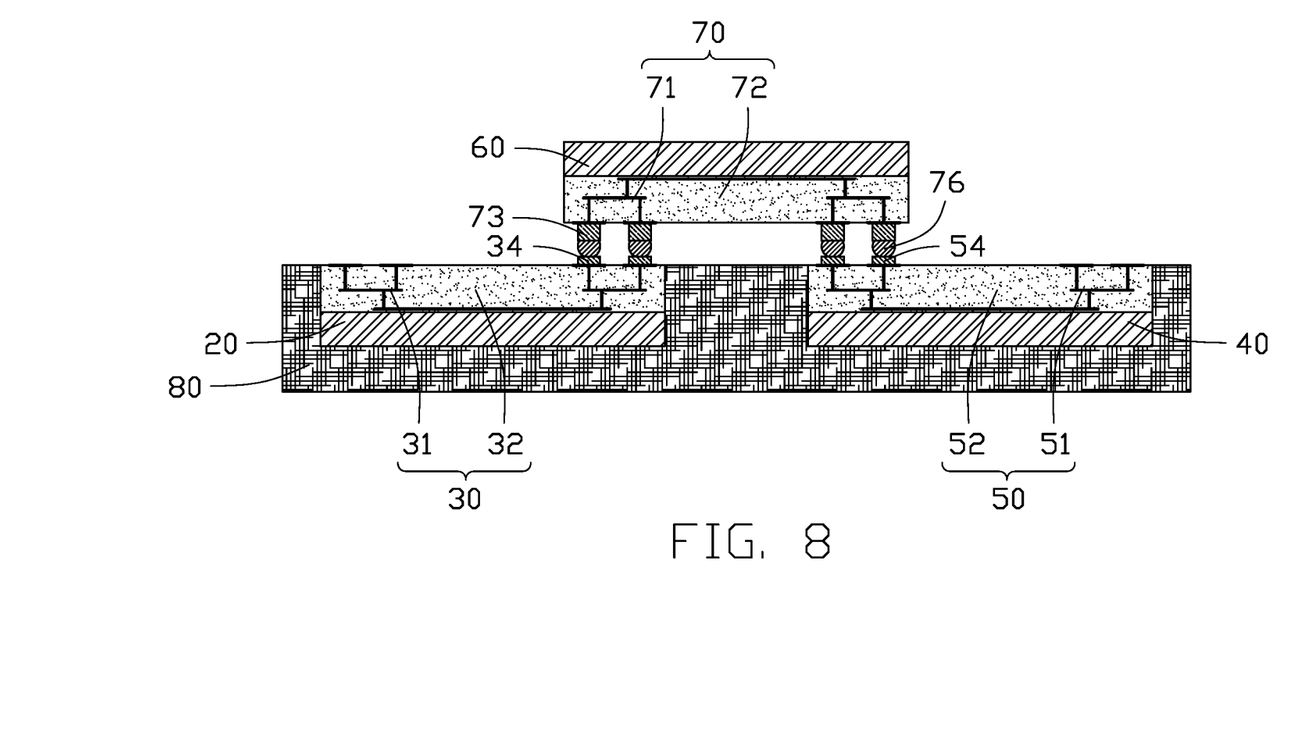
FIG. 8 is a cross-sectional view showing the structure of FIG. 7 bonded on the structure of FIG. 6.

Referring to FIG. 8, the third redistribution layer 70 is bonded to the first redistribution layer 30 and the second redistribution layer 50, and the third redistribution layer 70 is electrically connected to the first redistribution layer 30 and the second redistribution layer 50.

A surface of the third redistribution layer 70 facing away from the carrier 60 is provided with a plurality of third connection terminals 73 which are electrically connected to the third wiring 71. A surface of the first redistribution layer 30 facing away from the first chip 20 is provided with a second connection terminal 34 which is electrically connected to the first wiring 31. A surface of the second redistribution layer 50 facing away from the second chip 40 is provided with a second connection terminal 54 which is electrically connected to the second wiring 51. The third connection terminals 73 are connected to the second connection terminals 34 on the first redistribution layer 30 and the second connection terminals 54 on the second redistribution layer 50, so that the third redistribution layer 70 electrically connects the first redistribution layer 30 and the second redistribution layer 50, thereby achieving electrical connection between the first chip 20 and the second chip 40. In one embodiment, the third connection terminals 73 are electrically connected to the second connection terminals 34 and 54 by a plurality of solder balls 76.

Referring to FIG. 1, a structure formed after the third redistribution layer 70 is bonded to the first redistribution layer 30 and the second redistribution layer 50 is bonded to a base board 10. The first chip 20 and the second chip 40 are both electrically connected to the base board 10.

The base board 10 includes a first surface 11 and a second surface 12 facing away from the first surface 11. The first surface 11 is provided with a plurality of connecting portions 112 which are electrically connected to the first chip 20 and the second chip 40. The second surface 12 is electrically connected to a circuit board of an electronic device. The second surface 12 may be provided with a plurality of connections (not shown) which are electrically connected to the circuit board of the electronic device. The base board 10 is provided with a wiring layer (not shown) therein, and the wiring layer electrically connects the connecting portions 112 on the first surface 11 and the connections on the second surface 12.

The surface of the first redistribution layer 30 facing away from the first chip 20 is further provided with a first connection terminal 33, and the first wiring 31 electrically connects the first connection terminal 33 and the second connection terminal 34. The surface of the second redistribution layer 50 facing away from the second chip 40 is further provided with a first connection terminal 53, and the second wiring 51 electrically connects the first connection terminal 53 and the second connection terminal 54. The first connection terminal 33 on the first redistribution layer 30 and the first connection terminal 53 on the second redistribution layer 50 are electrically connected to the connecting portions 112 by the wires 18.

Referring to FIG. 2, the package structure further includes a second molding compound layer 90 which covers the first molding compound layer 80, the first redistribution layer 30, and the second redistribution layer 50. The second molding compound layer 90 defines a plurality of TMVs (TMV) 92, the first connection terminal 33 on the first redistribution layer 30 and the first connection terminal 53 on the second redistribution layer 50 are exposed from the TMVs 92. The package structure further includes a plurality of conductive structures 96 which infill the TMVs 92 and are electrically connected to the connecting portions 112 of the base board 10.

In the package structure and the manufacturing method, the first chip 20 is electrically connected to the second chip 40 by the first redistribution layer 30, the second redistribution layer 50, and the third redistribution layer 70, and the redistribution layer is formed by a layer-adding process, fabrication of a through via is not required. Therefore, it is easy to fabricate the redistribution layer, and the cost is low.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A manufacturing method of a package structure comprising:

providing a first chip and a second chip, forming a first redistribution layer on the first chip, and forming a second redistribution layer on the second chip, the first redistribution layer being electrically connected to the first chip, the second redistribution layer being electrically connected to the second chip;

forming a first molding compound layer which covers the first chip, the second chip, the first redistribution layer, and the second redistribution layer, a surface of the first redistribution layer away from the first chip and a surface of the second redistribution layer away from the second chip being exposed from the first molding compound layer;

providing a carrier and forming a third redistribution layer on the carrier;

bonding the third redistribution layer to the first redistribution layer and the second redistribution layer, the third redistribution layer electrically connecting the first redistribution layer and the second redistribution layer; and bonding the structure obtained in the step of bonding the third redistribution layer to the first redistribution layer and the second redistribution layer to a base board, wherein the first redistribution layer and the second redistribution layer are both electrically connected to the base board;

wherein a plurality of first connection terminals are arranged on the first redistribution layer and the second redistribution layer, a plurality of connecting portions are arranged on the base board and are electrically connected to the plurality of first connection terminals; and wherein the package structure further comprises a second molding compound layer and a plurality of conductive structures, the second molding compound layer covers the first molding compound layer, the first redistribution layer, and the second redistribution layer, the second molding compound layer defines a plurality of through mold vias exposing the plurality of first connection terminals, the plurality of conductive structures infill the plurality of through mold vias and electrically connect the plurality of first connection terminals and the plurality of connecting portions.

2. The manufacturing method of claim 1, wherein forming the first molding compound layer comprises:
   attaching the first redistribution layer and the second redistribution layer to a surface of a temporary carrier, the surface of first redistribution layer away from the first chip being flush with the surface of the second redistribution layer away from the second chip;
   forming the first molding compound layer covering the first chip, the first redistribution layer, the second chip, and the second redistribution layer;
   removing the temporary carrier, so that the surface of first redistribution layer away from the first chip and the surface of the second redistribution layer away from the second chip are exposed from the first molding compound layer.

3. The manufacturing method of claim 1, wherein each of the plurality of first connection terminals is electrically connected to a corresponding one of the plurality of connecting portions via a wire.

4. The manufacturing method of claim 1, wherein a plurality of second connection terminals are arranged on the first redistribution layer and the second redistribution layer, a plurality of third connection terminals are arranged on a surface of the third redistribution layer and are electrically connected to the plurality of second connection terminals.

* * * * *